(12) United States Patent
Suzuki et al.

(10) Patent No.: US 11,264,214 B2
(45) Date of Patent: Mar. 1, 2022

(54) SILICON CARBIDE MEMBER FOR PLASMA PROCESSING APPARATUS, AND PRODUCTION METHOD THEREFOR

(71) Applicants: HOKURIKU SEIKEI INDUSTRIAL CO., LTD., Ishikawa (JP); TOHOKU UNIVERSITY, Miyagi (JP)

(72) Inventors: Tomohisa Suzuki, Ishikawa (JP); Michito Miyahara, Fukuoka (JP); Masaru Sasaki, Ishikawa (JP)

(73) Assignees: HOKURIKU SEIKEI INDUSTRIAL CO., LTD., Miyagi (JP); TOHOKU UNIVERSITY, Miyagi (JP)

( * ) Notice: Subject to any disclaimer, the term of this patent is extended or adjusted under 35 U.S.C. 154(b) by 249 days.

(21) Appl. No.: 16/307,534

(22) PCT Filed: Sep. 13, 2017

(86) PCT No.: PCT/JP2017/033102
§ 371 (c)(1),
(2) Date: Dec. 6, 2018

(87) PCT Pub. No.: WO2018/061778
PCT Pub. Date: Apr. 5, 2018

(65) Prior Publication Data
US 2019/0304755 A1   Oct. 3, 2019

(30) Foreign Application Priority Data
Sep. 27, 2016   (JP) .............................. JP2016-188361

(51) Int. Cl.
*H01J 37/32* (2006.01)
*C23C 16/32* (2006.01)
(Continued)

(52) U.S. Cl.
CPC ...... *H01J 37/32467* (2013.01); *C23C 16/325* (2013.01); *H01J 37/32495* (2013.01);
(Continued)

(58) Field of Classification Search
CPC ........... H01J 37/32467; H01J 37/32495; H01J 37/32642; H01J 2237/3321;
(Continued)

(56) References Cited

U.S. PATENT DOCUMENTS 5,942,454 A   8/1999  Nakayama et al.
2003/0121475 A1   7/2003  Chu
(Continued)

FOREIGN PATENT DOCUMENTS

EP   0771769 A2 *  5/1997  ........... C04B 35/565
JP   10-120466 A   5/1998
(Continued)

OTHER PUBLICATIONS

Guo et al. "Sintering and microstructure of silicon carbide ceramic with Y3Al5O12 added by sol-gel method", Mar. 2005, J Zhejiang Univ SCI, 6B(3), p. 213-218 (Year: 2005).*
(Continued)

*Primary Examiner* — Keath T Chen
*Assistant Examiner* — Margaret D Klunk
(74) *Attorney, Agent, or Firm* — Paul D. Bianco; Katharine Davis; Fleit Intellectual Property Law

(57) ABSTRACT

A low-cost, durable silicon carbide member for a plasma processing apparatus. The silicon carbide member for a plasma processing apparatus can be obtained by processing a sintered body which is produced with a method in which metal impurity is reduced to more than 20 ppm and 70 ppm or less, and an α-structure silicon carbide power having an average particle diameter of 0.3 to 3 μm and including 50 ppm or less of an Al impurity is mixed with 0.5 to 5 weight
(Continued)

parts of a $B_4C$ sintering aid, or with a sintering aid comprising $Al_2O_3$ and $Y_2O_3$ with total amount of 3 to 15 weight parts, and then a mixture of the α-structure silicon carbide power with the sintering aid is sintered in an argon atmosphere furnace or a high-frequency induction heating furnace.

1 Claim, 3 Drawing Sheets

(51) Int. Cl.
*H01L 21/687* (2006.01)
*H01L 21/3065* (2006.01)

(52) U.S. Cl.
CPC .... *H01J 37/32642* (2013.01); *H01L 21/3065* (2013.01); *H01L 21/68735* (2013.01); *H01L 21/68757* (2013.01); *H01J 2237/3321* (2013.01); *H01J 2237/3341* (2013.01)

(58) Field of Classification Search
CPC .......... H01J 2237/3341; C23C 16/325; H01L 21/68735; H01L 21/68757
See application file for complete search history.

(56) References Cited

U.S. PATENT DOCUMENTS

| | | | |
|---|---|---|---|
| 2003/0134737 A1* | 7/2003 | Wotting | ............ C04B 35/62807 |
| | | | 501/97.1 |
| 2016/0207782 A1* | 7/2016 | Diwanji et al. | |
| 2017/0076835 A1* | 3/2017 | Lee et al. | |

FOREIGN PATENT DOCUMENTS

| | | |
|---|---|---|
| JP | 11-217268 A | 8/1999 |
| JP | 2001-007082 A | 1/2001 |
| JP | 2003-095744 A | 4/2003 |
| JP | 2003176178 A | 6/2003 |
| JP | 2005267931 A | 9/2005 |
| JP | 2007-112641 A | 5/2007 |

OTHER PUBLICATIONS

English translation of International Preliminary Report on Patentability dated Apr. 2, 2019 for PCT/JP2017/033102 filed Sep. 13, 2017.
International Search Report dated Oct. 17, 2017 for PCT/JP2017/033102 filed Sep. 13, 2017.
Written Opinion for PCT/JP2017/033102 filed Sep. 13, 2017.

* cited by examiner

FIG. 4A
Genuine Product
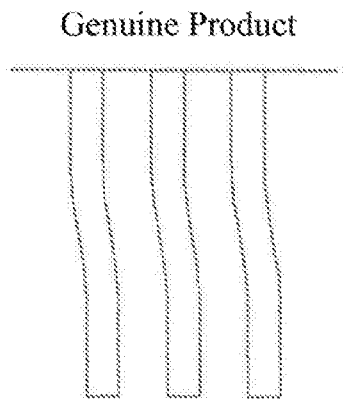
FIG. 4B
Inventive Product
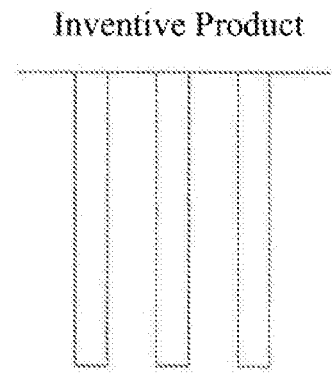
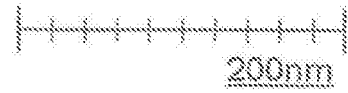
FIG. 4C

SILICON CARBIDE MEMBER FOR PLASMA PROCESSING APPARATUS, AND PRODUCTION METHOD THEREFOR

TECHNICAL FIELD

Present invention relates to a silicon carbide member for plasma processing apparatus designed to manufacture various semiconductor devices, and a method of producing the silicon carbide member.

BACKGROUND ART

Heretofore, in a manufacturing process of a semiconductor device, plasma processing techniques have been used to perform film-forming and etching for a semiconductor wafer; and in addition, a chamber cleaning using a fluorine-based gas is carried out.

FIG. 1 is a sectional view of a reactive ion etching (RIE) apparatus which comprises a reaction chamber 2 for subjecting a semiconductor wafer 1 to etching, and a showerhead type upper electrode 3 and a lower electrode 4 arranged, respectively, on upper and lower sides of the reaction chamber 2 in opposed relation to each other.

As a principle, when an etching gas is supplied into the reaction chamber 2, and electric power is applied from a high-frequency power supply 10 to the lower electrode 4, plasma is generated in the reaction chamber 2. In the case where the RIE apparatus is a parallel plate-type RIE apparatus as depicted in FIG. 1, upon application of electric power from the high-frequency power supply 10 to the lower electrode 4, a self-bias potential is generated between the semiconductor wafer 1 and the plasma, and active species such as ions and radicals in the plasma are accelerated in a direction toward the semiconductor wafer 1 (direction perpendicular to a wafer surface). The active species can etch (anisotropically etch) the semiconductor wafer 1 only in the direction perpendicular to the wafer surface, based on a physical effect and a chemical reaction effect of sputtering, thereby enabling high-accuracy microprocessing.

In operation of etching the semiconductor wafer 1, an internal space of the reaction chamber 2 is first evacuated to a vacuum state by a vacuum pump (not depicted) connected to an downstream side of an exhaust plate 7, and the etching gas is supplied from the shower head type upper electrode 3.

The showerhead type upper electrode 3 is composed of a disk-shaped member having a hollow portion 5, and comprising a lower wall formed with a large number of gas supply holes 6 in a showerhead-like arrangement. The etching gas is supplied from an etching gas supply source (not depicted) to the hollow portion 5 and then supplied into the reaction chamber 2 through the gas supply holes 6 in a uniform flow rate distribution.

After the supply of the etching gas, electric power is applied from the high-frequency power supply 10 to the lower electrode 4, so that plasma is generated in the reaction chamber 2. The semiconductor wafer 1 is etched by active species in the plasma.

Patent Document 1 (JP 2007-112641 A) describes a technique intended to provide a focus ring (edge ring) having plasma resistance to high-density plasma, wherein the focus ring is formed of a sintered composite obtained by: adding an organic binder to an mixed powder of yttria powder and aluminum powder; kneading and forming the resulting mixture to prepare a shaped body; and then burning the shaped body in a hydrogen or inert atmosphere at a temperature of 1520° C. or less, wherein the focus ring has a specific resistance (electric resistivity) of less than $10^9$ $\Omega \cdot cm$.

Patent Document 2 (JP H11-217268A) describes a SiC sintered body for a plasma apparatus, which exhibits excellent plasma resistance and has a low risk of particle contamination due to drop-off of particles, wherein the SiC sintered body has a density of 2.7 g/cm$^3$ or more, an average crystal grain size of 20 μm or more, a thermal conductivity of 80 W/m·K or more, and an electric resistivity of $10^{-2}$ to $10^2$ $\Omega \cdot cm$. Although the Patent Document 2 discloses sintered bodies using α-structure silicon carbide (hereinafter referred to as "α-SiC") as a primary raw material, in Examples 3 and 5, it also discloses sintered bodies using β-structure silicon carbide (hereinafter referred to as "β-SiC") as a primary raw material in detail in Examples 1, 2 and Comparative Examples 1, 2 with detailed description. As regards the sintered bodies using α-SiC as a primary raw material, properties thereof are not shown, except for the matters described in Table 1. Specifically, as to a content rate of free carbon, Table 1 presents higher values than those of the remaining Examples and Comparative Examples, and, as to electric resistivity, presents relatively high values, specifically, 0.4 $\Omega \cdot cm$ in Example 3 and 5.0 $\Omega \cdot cm$ in Example 5. Thus, the sintered bodies in Examples 3 and 5 are not formed to have particularly excellent properties.

Moreover, although the sintered body in Example 3 is sintered at a highest temperature of 2400° C., the density thereof is 3.1 g/cm$^3$ at most, and the crystal grain size is less than those of Examples 1 and 2. Thus this sintered body is more likely to be charged with electric charges, and is thus inferior in plasma resistance.

Patent Document 3 (JP 2003-095744A) includes the following descriptions in paragraph [0008]: "as shown in Sample No. 2 to Sample No. 13, the silicon carbide sintered body of the present invention is understand to be a sintering material which is excellent in strength and hardness based on a dense and substantially pore-free microstructure over which a YAG phase is finely dispersed." (lines 31 to 34 of 5th column); and "When a semiconductor-producing member using the silicon carbide sintered body of the present invention in each of Sample Nos. 2 to 13 and Sample Nos. 16 and 17 was mounted on a semiconductor-manufacturing device, diffuse reflection due to pores was remarkably suppressed, so that device accuracy was improved and improvement in semiconductor manufacturing efficiency was ascertained." (lines 35 to 39 of 6th column). However, as described in the paragraph [0008] as follows: "crystal regions of silicon carbide exhibited substantially the same physical property values, irrespective of which of α phase, β phase and α+β composite phase each of the crystal regions has" (lines 36 to 38 of 5th column), Patent Document 3 makes no mention of recognition that the sintered body made of the α-phase silicon carbide crystal phase is particularly excellent.

Further, recently, an edge ring formed of silicon carbide (hereinafter referred to as "SiC") having high plasma resistance has become widespread. In this regard, with a view to preventing metal contamination in the reaction chamber 2, high-purity β-SiC prepared by a chemical vapor deposition (CVD) process, or a sintered body obtained by hot-pressing a SiC powder prepared by a CVD process, is employed, and a primary raw material thereof is β-SiC.

The SiC member using α-SiC as a primary raw material has been considered to cause chamber contamination, because it contains metal impurities such as iron in an amount greater than those in the SiC member prepared by CVD process using β-SiC as a primary raw material. For this reason, an idea of using α-SiC as a raw material for a member for a plasma processing apparatus has been unlikely to be created, and plasma resistance of α-SiC has not been checked in detail.

Patent Document 4 (JP H10-120466A) discloses a highly anti-corrosive silicon carbide member usable in a plasma etching apparatus for semiconductor manufacturing, wherein the member is formed of a sintered body with the α-SiC content of 90% or more by weight.

Patent Document 5 (JP 2001-007082A) discloses an electrode plate for plasma etching which is excellent in the plasma resistance and can realize a long durability, wherein the electrode plate is formed of a silicon carbide sintered body mainly comprising α-SiC of a 6H type.

However, in Patent Document 4, the member including very small quantities of metal impurities with the iron content of 1 ppm or less, the aluminum content of 5 ppm or less, and the calcium content of 3 ppm or less is used; and it is described that the weight reduction rate is large in α-SiC which includes 18 ppm of Al as described in Comparative Example 1 (see claim 1, paragraphs 0039 to 0040, and Table 1).

In addition, in Patent Document 5, it is described that the raw material SiC powder to be suitably used includes metal elements with total content of 40 ppm or less, preferably 30 ppm or less, more preferably 20 ppm or less, while most preferably 10 ppm or less (paragraph 0027).

CITATION LIST

Patent Documents

Patent Document 1: JP 2007-112641A
Patent Document 2: JP H11-217268A
Patent Document 3: JP 2003-095744A
Patent Document 4: JP H10-120466A
Patent Document 5: JP 2001-007082A

SUMMARY OF THE INVENTION

Problems to be Solved by the Invention

The edge ring described in the Patent Document 1 has a very large specific resistance (electric resistivity) of less than $10^9$ Ω·cm, and no verification about impurity diffusion has been made. Moreover, it is also not clear whether the plasma resistance of the edge ring in the Patent Document 1 is superior to that of an edge ring formed of SiC.

Although an edge ring formed of SiC has excellent properties in terms of plasma resistance, purity and the like, as compared with an edge ring formed of polysilicon, $SiO_2$ or the like, the edge ring requires a production cost which is about ten times that of the edge ring formed of polysilicon, $SiO_2$ or the like, because it employs high-purity SiC prepared by a CVD process, or a sintered body obtained by hot-pressing a β-SiC powder prepared by a CVD process in order to prevent metal contamination in the reaction chamber 2. Thus, the edge ring formed of SiC is significantly expensive, considering its performance.

Further, plasma resistance of the SiC prepared by a CVD process or the SiC obtained by hot-pressing a β-SiC powder prepared by a CVD process is not so high although it has ultra-high purity of 0.1 ppm or less, i.e., an amount of metal impurities is low by one or more digits, and is very costly. Thus, such SiC becomes a factor causing an increase in running cost. In addition, in the case when the member for a plasma etching apparatus formed of the silicon carbide sintered body mainly comprising α-SiC is used, further increase in the plasma resistance is required.

The present invention has been made in view of solving the above conventional problem, and an object thereof to provide a SiC member capable of being produced at lower cost with high plasma resistance, and further provide a production method for the SiC member.

Means for Solving the Problems

According to a first aspect of the present invention, there is provided a silicon carbide member for a plasma processing apparatus, which consists of a sintered body, sintering a shaped body of an a-structure silicon carbide raw material powder containing metal impurities in an amount of 37 to 70 ppm and an Al impurities in an amount of 28 to 45 ppm and free $SiO_2$ components to become 0.3% or less before sintering, and an oxide-based sintering aid at a temperature of 1800° C. to 2200° C., wherein the oxide-based sintering aid comprises $Al_2O_3$ and $Y_2O_3$, wherein a total amount of the $Al_2O_3$ and the $Y_2O_3$ is the range of 3 to 15 weight parts as relative to 100 weight parts of the α-structure silicon carbide, and a weight of the $Y_2O_3$ is 1 to 2 times a weight of the $Al_2O_3$, wherein $Al_2Y_4O_9$ exists in a grain boundary of an α-silicon carbide crystal grain.

Advantageous Effects of Invention

In the silicon carbide member according to the first aspect of the invention, the silicon carbide member consists of a sintered body, sintering a shaped body of an α-structure silicon carbide raw material powder containing metal impurities such as iron in an amount of 37 to 70 ppm and an Al impurities in an amount of 28 to 45 ppm and free $SiO_2$ components to become 0.3% or less before sintering, and an oxide-based sintering aid at a temperature of 1800° C. to 2200° C. Thus, it becomes possible to produce the silicon carbide member with high plasma resistance at low cost without any adverse influence of the metal impurities on a plasma processing apparatus.

In addition, the oxide-based sintering aid comprises $Al_2O_3$ and $Y_2O_3$, wherein a total amount of the $Al_2O_3$ and the $Y_2O_3$ is the range of 3 to 15 weight parts as relative to 100 weight parts of the α-structure silicon carbide, and a weight of the $Y_2O_3$ is 1 to 2 times a weight of the $Al_2O_3$, wherein $Al_2Y_4O_9$ exists in a grain boundary of an α-silicon carbide crystal grain and it becomes possible to further improve the plasma resistance of the silicon carbide member for a plasma processing apparatus.

This makes it possible to improve durability of an edge ring or other silicon carbide member for use in various plasma processing apparatuses and realize mass production and cost reduction thereof.

BRIEF DESCRIPTION OF THE DRAWINGS

[FIGS. 4A-4C]

FIGS. 4A and 4B illustrate the cross section shape of the holes formed in a genuine product (CVD-SiC) currently used as the edge ring and the cross section shape of the holes formed in the multilayered film by etching using the edge ring formed of the sintered body of the present invention. FIG. 4C illustrates the scale used in FIGS. 4A and 4B.

FIG. 4A is a view depicting a sectional shape of a hole formed in a multilayered film by etching using a conventional edge ring currently commonly used as a genuine product (CVD-SiC); and FIG. 4B is a view depicting a sectional shape of a hole formed in a multilayered film by etching using an inventive edge ring formed of a sintered body according to the present invention.

DESCRIPTION OF THE EMBODIMENTS

Figure 1:
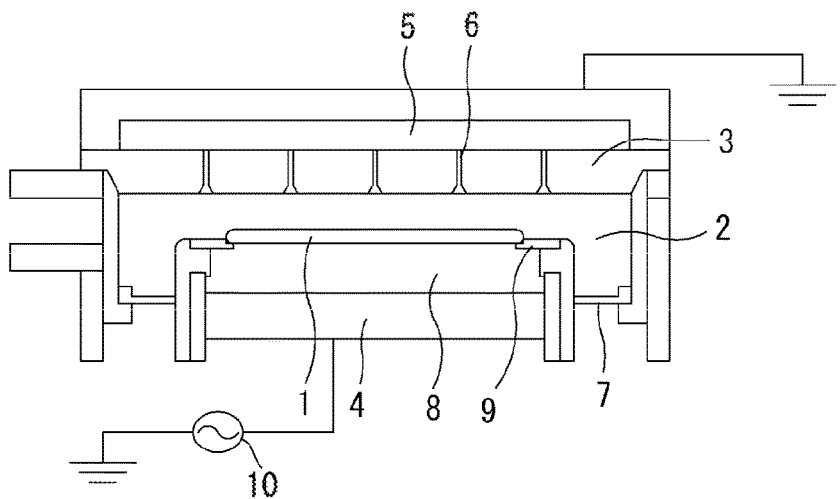
FIG. 1 is a sectional view of a reactive ion etching apparatus.

The present invention will now be described based on various Examples (production process of an edge ring).

Example 1

<First Step>

As a primary raw material, α-SiC particles (purity: about 98.5%) having an average particle size of 0.6 µm were employed, wherein the α-SiC particles was subjected to chemical cleaning to enable impurities therein, such as elements of groups I to VIII of the 4th rows of the periodic table, and oxides, carbides, nitrides, borides or the like of the elements (hereinafter, these are referred to as "4th row metal impurity"), to becomes minute amount, and enable free $SiO_2$ components to become 0.3% or less.

Then, impurities of the $4^{th}$ row metal impurity as well as the metal impurity such as the Al impurity in the various main raw material samples were analyzed; and as a result, the total amount thereof was 37 to 70 ppm in which the Al impurity was 28 to 45 ppm and the metal impurity other than Al was 9 to 25 ppm.

Next, as a sintering aid for α-SiC particles, a $B_4C$ raw material powder having a purity of 99% or more and an average particle size of 1 µm or less was prepared.

$B_4C$ as a sintering aid was added to the above α-SiC raw material powder in respective amounts of 0.5 weight parts, 1.5 weight parts, 2 weight parts, 3 weight parts and 5 weight part to prepare five types of mixed powders, and then 3 weight parts of acrylic-based water-soluble binder as a shaping aid, and pure water as a solvent, were added to respective ones of the mixed powders to prepare three types of mixtures.

<Second Step>

Each of the mixtures was subjected to pulverization using a ball mill pot made of nylon and nylon-coated balls to prepare a slurry, and a granulated powder was prepared from the slurry by using a spray dryer. Further, the granulated powder was subjected to press-forming at a pressing force of 1000 kg/cm² to prepare five types of 50 mm-square test pieces.

<Third Step>

The five types of test pieces were heated and degreased in a vacuum atmosphere, and after being putting into an argon atmosphere furnace, sintered at a temperature of 2160° C. to obtain five types of sintered bodies.

As a result of measuring the density of each of these sintered bodies, it was proven that each of the test pieces was formed as a dense sintered body having a density with respect to a theoretical density of 98.1% or more (specific gravity of those blended with 1.5 weight parts of $B_4C$ was 3.14 or more).

Meanwhile, the theoretical density of the raw material powder was calculated by using the specific gravity of each component blended, i.e., SiC=3.21, $Al_2O_3$=3.987, $Y_2O_3$=5.01, and $B_4C$=2.52; and then, the relative density of the sintered body was calculated.

<Fourth Step>

An edge ring having an outer diameter of about 350 mm, an inner diameter of about 295 mm and a thickness of about 5 mm can be produced by processing the sintered body having a size appropriate to this dimension. [Example 3]

Example 2

<First Step>

The same α-SiC raw material powder as that used in Example 1, and a fine $Al_2O_3$ powder having a purity of 99.99% or more and an average particle size of 0.5 µm as one component of the sintering aid for α-SiC were preliminarily prepared.

A fine $Y_2O_3$ powder having a purity of 99.9% or more and an average particle size of 1 µm or less as another component of the sintering aid for α-SiC was also preliminarily prepared.

Further, fine powders of $Al_2O_3$ with the purity of 99.99% and of $Y_2O_3$ with the purity of 99.9% each having an average particle size of 0.5 µm or less were preliminarily prepared.

3 weight parts of acrylic-based water-soluble binder as a shaping aid and pure water as a solvent were added to the mixture, wherein the mixture consists of 100 weight parts of the α-SiC raw material powder, 2.5 weight parts of the $Al_2O_3$ raw material powder and 5 weight parts of the $Y_2O_3$ raw material powder.

<Second Step>

As with Example 1, the mixture was subjected to pulverization to prepare a slurry, and a granulated powder was prepared from the slurry by using a spray dryer. Further, the granulated powder was subjected to press-forming at a pressing force of 1000 kg/cm² to prepare 50 mm-square test piece.

<Third Step>

The test piece was heated and degreased in a vacuum atmosphere, and after being putting into an argon atmosphere high-frequency induction heating furnace, sintered at a temperature of 1860° C. to obtain the sintered body.

As a result of density measurement thereof, it was found that the dense sintered body having the specific gravity of 3.16 (relative density of 96.3%) was obtained.

As a result of measuring the density of the sintered body, it was proven that the test pieces were formed as a dense sintered body having a specific gravity of 3.16 (relative density of 96.3%).

The shaped body obtained by using the fine powder of $Al_2O_3$ with the average particle diameter of 0.5 µm $Y_2O_3$ with the average particle diameter of 0.5 µm or less was sintered in a resistance heating argon atmosphere furnace; as a result, it could be sintered in a comparatively low temperature region of 1800 to 1900° C. to obtain the dense sintered body with the specific gravity of 3.18 (relative density of 97%).

Example 3

<First Step>

B$_4$C as a sintering aid was added to the same α-SiC raw material powder as that used in Example 1, in an amount of 1.5 weight parts to prepare a mixed powder, and then a methanol solvent was added to the mixed powder without adding any shaping aid to prepare a mixture.

<Second Step>

As with Example 1, the mixture was subjected to pulverization to prepare a slurry, and the slurry was dried to prepare a shaping powder.

<Third Step>

The shaping powder was sintered by hot pressing under conditions comprising a pressurizing force of 200 kg/cm$^2$ and a temperature of 2100° C., to obtain a sintered body with the size of 50 mm square.

As a result of measuring the density of the obtained sintered body, it was proven that the test piece was formed as a dense sintered body having a specific gravity of 3.193 (relative density: 99.8%).

<Fourth Step>

An edge ring having an outer diameter of about 350 mm, an inner diameter of about 295 mm, and a thickness of about 5 mm can be produced by processing a sintered body having a size appropriate to this dimension.

Example 4

In order to study the relationship of the blending amount of the SiC raw material powder and the sintering aid with the difference in the density (specific gravity) of the sintered body, and with the plasma resistance, various materials were prepared.

(1) SiC Raw Material Powder

By using the same raw material powder as the one used in Example 1 (hereinafter this is referred to as "S1"), a commercially available SiC raw material powder with the SiC purity of 98.5%, SiO$_2$ content of 0.8%, impurity (Fe) of 0.03%, and metal Al of 0.02% was prepared as the raw material for comparison (hereinafter this is referred to as "S2").

(2) Sintering Aids

With regard to B$_4$C as the sintering aid, the same raw material powder as the one in Example 1 was used.

With regard to Al$_2$O$_3$ as one component of the oxide sintering aid, the same raw material powder as the one in Example 2 was used.

With regard to Y$_2$O$_3$ as the other component of the oxide sintering aid, the raw material powder with the purity of 99.9% or more and the average powder particle diameter of 0.5 μm or less was used.

(3) Mixing of Various Raw Material Powders and Formation of the Press-Forming Body Similarly to Example 1, to various blended powders were added the acryl-type binder and a solvent (water), and then they were crushed and mixed by means of the nylon-made ball mill pot and nylon-coated balls; and then, the granulated powder thus obtained was press-forming with the applied pressure of 1000 kg/cm$^2$ to prepare various green bodies with the size of 50 mm square.

(4) Sintering

After the various green bodies were degreased by heating with a vacuum atmosphere furnace, the sintering temperature was controlled in an argon atmosphere furnace to prepare the sintered bodies with different specific gravities; and then, the test pieces for assessment of the plasma resistance having the sample size of 20x20 mm square with the thickness of 5 mm were prepared.

In Table 1, as the test pieces for the plasma resistance assessment, β-SiC prepared by the CVD method (hereinafter this is referred to as "CVD-SiC"), which is currently widely used as the edge ring member (sample No.: shown as St), the sintered body with a large amount of iron impurities prepared for comparison in Example 4 (sample No.: shown as #1), and the formulated composition of the sintered body prepared in the present Examples (sample No.: shown as #2 to #6), as well as the material characteristics of each, are summarized; and also, the Al$_2$O$_3$ material with the purity of 99.99%, which was filed for patent application as the material for a shower plate (sample No.: shown as #7), was tested for comparison.

TABLE 1

| Sample No. | Formulated Composition | Specific Gravity | Resistivity (Ω cm) | Thermal Conductivity (W/m · K) | Hardness (Hv) | Flexural Strength (MPa) | Dielectric Loss (Note) |
|---|---|---|---|---|---|---|---|
| St | CVD-SiC | 3.22 | 1.6 × 10$^6$ | 245 | — | — | — |
| #1 | S2-2%Al$_2$O$_3$—4%Y$_2$O$_3$ | 3.13 | 3.7 × 10$^5$ | 84 | 1582 | 389 | 0.07 |
| #2 | S1-2%Al$_2$O$_3$—4%Y$_2$O$_3$ | 2.87 | 2.0 × 10$^5$ | 68 | 586 | 230 | 0.08 |
| #3 | S1-1.5%B$_4$C | 3.08 | 1.6 × 10$^8$ | 146 | 2326 | 255 | 0.52 |
| #4 | S1-3.5%Al$_2$O$_3$—7%Y$_2$O$_3$ | 3.13 | 1.3 × 10$^6$ | 99 | 1539 | 353 | 0.11 |
| #5 | S1-3.5%Al$_2$O$_3$—7%Y$_2$O$_3$ | 3.14 | — | — | — | 395 | — |
| #6 | S1-3.5%Al$_2$O$_3$—7%Y$_2$O$_3$ | 3.15 | 1.4 × 10$^7$ | 92 | — | 415 | — |
| #7 | 99.99%Al$_2$O$_3$ | 3.8 | — | — | — | 458 | 10$^{-4}$ |

Note:
The dielectric loss was measured by applying the power with the frequency of 13.56 MHz.

The plasma resistance test was carried out as follows. A small sample piece with the sample area of 20×20 mm and the thickness of 5 mm was plasma-exposed with a microwave-excited plasma apparatus for an 8-inch wafer (manufactured by Tokyo Electron Ltd.), whereby the plasma resistance was assessed with the weight change before and after the etching. The plasma conditions were as follows: the source power of 2000 W (frequency of 2.45 GHz), the bias power of 30 W (frequency of 13.56 MHz), the gas flow rate of 60 sccm using SF$_6$ gas, the pressure of 100 mTorr, and the irradiation time for plasma exposure of 5 hours (total). Because the plasma irradiation for a long time was difficult, the plasma irradiation for a period of 15 minutes was repeated 20 times.

Meanwhile, St in the sample No. column is CVD-SiC, and in #1 and #2, Al$_2$O$_3$ and Y$_2$O$_3$ the sintering adjuvants, are the same while the SiC raw material powders are different, and moreover, the sintered body in #2 has the specific gravity of less than 3.0 by lowering the sintering temperature.

In #4, #5, and #6, reproducibility in production of the sintered body was studied using the same SiC raw material and oxide sintering aids under the same sintering condition, whereby almost the same density of the sintered body was obtained.

Figure 2:
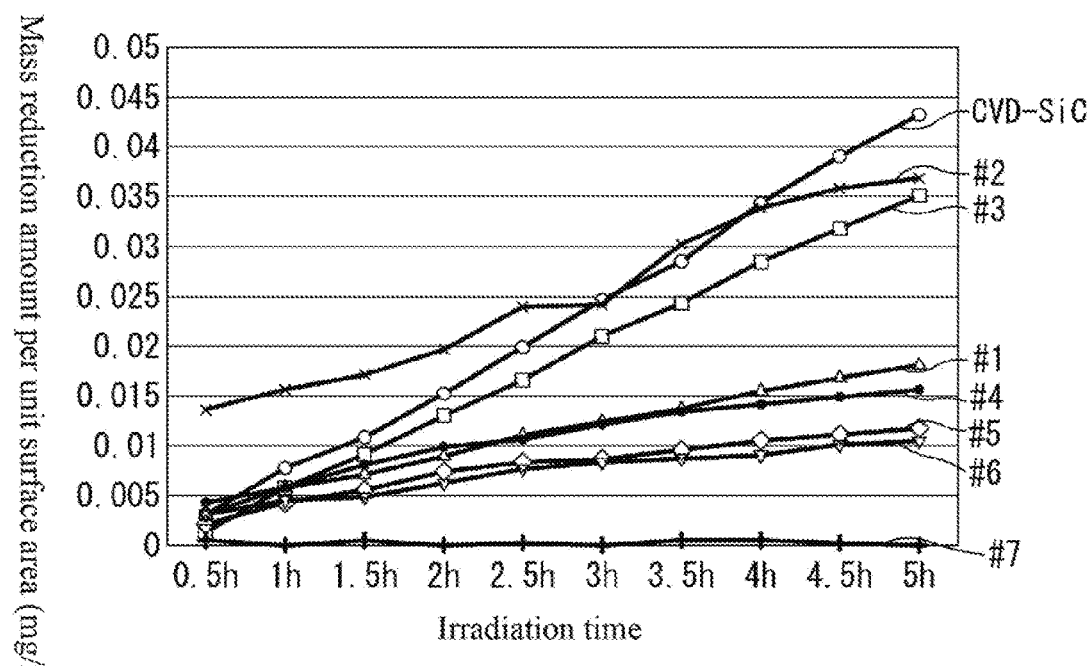
FIG. 2 is a graph showing the relationship between the plasma irradiation time and the mass reduction amount per unit surface area.

FIG. 2 is a graph in which the SiC materials shown in Table 1 were subjected to the aforementioned plasma resistance test, and then the mass reduction amount after the plasma irradiation was divided with surface area of the test sample.

In this figure, it can be seen that the CVD-SiC, which is widely used in the edge ring of the plasma processing apparatus as the material which is excellent among many SiC materials in the particle anti-fouling, in the plasma resistance, etc., shows the largest mass reduction amount.

Next, the sample No. #2 shows a large mass reduction curve, indicting poor plasma resistance, because the specific gravity of the sintered body is less than 3.0 (relative density of less than 87.3%), namely, because the specific gravity is low.

In #3 in which the SiC material using the $B_4C$ type sintering aid is used, the specific gravity thereof is 3.08 (relative density of 96.3%), showing superior plasma resistance to CVD-SiC in spite of a low relative density.

In #1, the SiC raw material with a high iron impurity content of 0.03% (300 ppm) is used; however, the mass reduction amount is half or less of the CVD-SiC, showing excellent plasma resistance.

It is presumed that this is owing to the dense sintered body with the sintered body's specific gravity of 3.13 (relative density of 95.3%), the dielectric loss in the $10_{-2}$ level, as well as the presence of the YAM phase component ($Al_2Y_4O_9$) in the SiC crystal grain boundary.

However, because #1 includes ion impurities about 100 times as much as those in the silicon carbide member of the present invention, the plasma resistance thereof is inferior to #4 whose relative density is lower than #1. On top of it, there is a metal fouling problem. Therefore, this cannot be a suitable material.

The specific gravity values of #4, #5, and #6 are 3.13 (relative density of 94.8%), 3.14 (relative density of 95.2%), and 3.15 (relative density of 95.5%), respectively, wherein in all of them not only there is the YAM phase component in the SiC crystal boundary but also the mass reduction amount due to the plasma irradiation tends to be smaller as the relative density becomes higher. Because as compared with the CVD-SiC the mass reduction amounts of #4, #5, and #6 are 35%, 29%, and 25%, respectively, it can be seen that the plasma resistance is increased about 3 to 4 times.

Meanwhile, because the dielectric loss of #4 is measured in the level of $1\times10^{-1}$, it is presumed that #5 and #6 show almost the same value as #4.

Meanwhile, $Al_2O_3$ of #7 which is disclosed in the prior patent as the material for a shower plate shows almost zero as the mass reduction amount caused by the plasma irradiation, so that it is not etched in the level observable in the mass reduction; however, minute amount of Al is sputtered by the ion irradiation from the plasma so as to be scattered into a gas phase thereby adhering to the wafer.

Therefore, $Al_2O_3$ causes adverse effects such as an increase in the leak current to the device to be manufactured.

On the other hand, SiC is suitable because the mother material thereof is Si, the same material as the wafer; and C can volatilize more readily than Al with a fluorine gas, so that it does not cause an adverse effect to the device.

The reason for the high values in the plasma resistance in the sintered bodies of #1, #4, #5, and #6 is presumed as follows. Namely, all of them are dense sintered bodies with the relative densities of about 95% or more; and moreover the YAM phase component ($Al_2Y_4O_9$) is present in the crystal grain boundary of SiC thereby intensifying the bonding strength of the crystal grains, and in addition, $Al_2Y_4O_9$ itself has the plasma resistance.

For comparison, the plasma resistance of #2 is poor presumably because not only the sintered body thereof is not dense with the specific gravity of 2.87 (relative density of 87%) but also the YAM phase component is not present.

On the other hand, by using $B_4C$, the non-oxide sintering aid, a dense sintered body with the specific gravity of 3.14 (relative density of 98.2%) was prepared separately from the test sample of #3, and then, the plasma was irradiated to it for the total time of 5 hours under the same condition as Example 4. As a result of the test, it was found that the plasma resistance was significantly increased as compared with #3, because the mass reduction amount of 0.026 $mg/mm^2$, which is about 60% of CVD-SiC, was obtained.

The impurity concentration of iron (Fe) and nickel (Ni), which is the largest problem in the members such as a shower plate and an edge ring of the plasma processing apparatus, is about 0.01 ppm in CVD-SiC of the sample No. St; and in the β-SiC raw material powder to be sintered by a hot-press method, it is described that the concentrations of Fe and Ni are 0.05 and 0.05 ppm or less, respectively, so that by using the high purity members it is contemplated not to cause an adverse effect due to the impurities in any member.

On the other hand, the Si raw material powders comprising α-SiC used in the sample No. #4, #5, and #6 include 3 to 10 ppm of Fe impurities and 0.5 to 1 ppm of Ni impurities; however, it was confirmed that when the sintering was carried out such that the relative density became 93% or more, content of the impurities in the sintered body was decreased to half or less by measurement with the glow discharge mass spectrometry method.

Especially, it was found that when a high-frequency induction heating method was used as the heating method at the time of manufacturing the sintered body, reduction degree of the iron impurities was large.

The sample No. #3 using $B_4C$ as the sintering aid and the sintered body with the relative density of 98.2% showed results somewhat inferior to #4, #5, and #6 in the plasma resistance test; however, because the $B_4C$ sintering aid can be volatilized by a fluorine-type gas, the blending amount of the sintering aid can be reduced to 0.5 weight parts, i.e., ⅓ of #3. Therefore, not only the mass reduction amount due to the plasma irradiation can be decreased, but also B and C that are volatilized by the fluorine-type gas do not adhere to the semiconductor wafer as the particle, so that it can be suitably used as the member for the plasma processing apparatus.

Next, in the high purity $Al_2O_3$ of the sample No. #7, because the mass reduction amount due to the plasma irradiation is almost zero, it appears to be the best as the member for the plasma apparatus; however, minute amount of Al is scattered into a gas phase by sputtering with ion irradiation from the plasma so as to be adhered to the semiconductor wafer thereby causing adverse effects such as an increase in the leak current to the device to be manufactured.

In addition, $Al_2O_3$ has a large heat capacity because of a large specific heat, and moreover, it has a comparatively a low thermal conductivity and a large thermal expansion coefficient; and thus, this is not suitable for rapid heating and cooling in order to increase the operation rate of the plasma apparatus.

When the material obtained by sintering the blended powder of the component comprising the SiC raw material powder and the sintering aid of the present invention so as to give the relative density of 93% or more is applied for the shower plate, not only the dielectric loss thereof is about $10^{-1}$ to $10^{-2}$, but also the metal impurity content is small; thus, the ratio of the power consumed for self-heating of the shower plate is small, the power being supplied from the high-frequency power supply; and in addition, the flexural strength and thermal conductivity thereof are sufficient, so that this can respond to rapid heating and cooling, and moreover, the plasma resistance is superior to CVD-SiC. Accordingly, the shower plate having a complex shape can be manufactured with a comparatively low cost, and the member for the plasma apparatus sophisticated than ever can be supplied.

Meanwhile, in this case, the shower plate 3 in FIG. 1 is electrically insulated from the inner wall, whereby it is used as a plasma-excited electrode by applying a high-frequency power.

Example 5

100 weight parts of the same α-SiC raw material powder as the one used in Example 1, 3.5 weight parts of $Al_2O_3$ with the purity of 99.99% and the average particle diameter of 0.5 μm, and 7 weight parts of $Y_2O_3$ with the purity of 99.9% and the average particle diameter of 0.5 μm were mixed to prepare a granulated powder. Further, the obtained granulated powder was subjected to press-forming at a pressing force of 1 ton/cm² to prepare a shaped body, degreasing the obtained shaped body and then sintering the resulting degreased body in a resistance heating argon atmosphere furnace at a temperature of 1800 to 1900° C. to produce an edge ring having a specific gravity of 3.15 (relative density of 95.5%) and an electric resistivity of $7.6×10^5$ Ω·cm.

Figure 3:
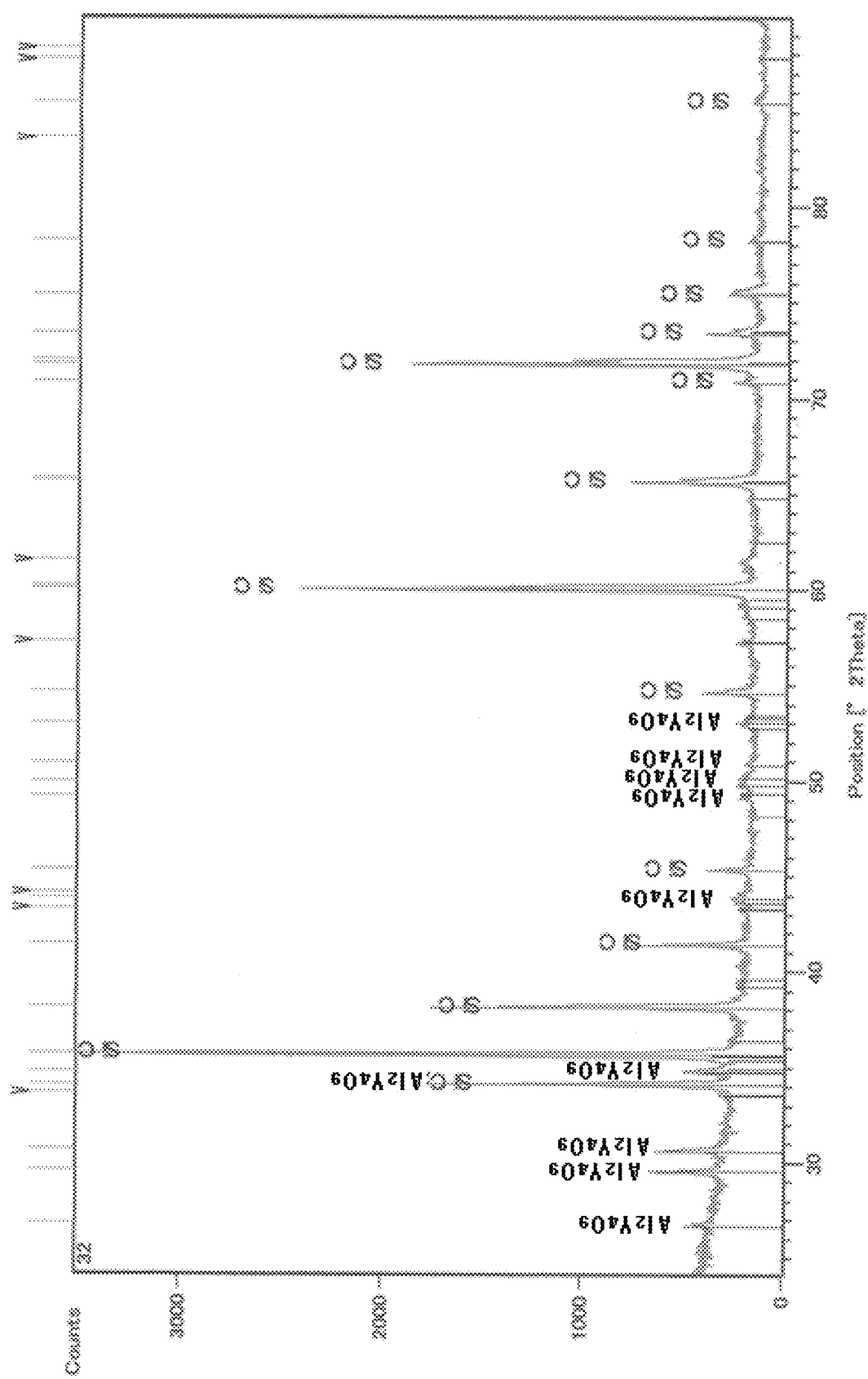
FIG. 3 is an X-ray diffraction chart of an α-SiC sintered body according to the present invention, wherein the α-SiC sintered body uses $Al_2O_3$ and $Y_2O_3$ as a sintering aid.

Crystal structure analysis by X-ray diffraction was carried out to check the material property of this edge ring. The X-ray diffraction chart is presented in FIG. 3.

This X-ray diffraction chart shows that the peak of the SiC component, and the peak of the YAM phase component ($Al_2Y_4O_9$) generated from the sintering aid comprising $Al_2O_3$ and $Y_2O_3$, are present.

Meanwhile, as the result of detailed analysis of the crystal structure by the X-ray diffraction, presence of the $Y_2O_3$ component was faintly confirmed.

As a result of detailed crystal structure analysis by X-ray diffraction, it was ascertained that $Y_2O_3$ component existed slightly.

Therefore, it can be said that the α-SiC sintered body of the present invention has a microstructure in which $Al_2O_3$ and $Y_2O_3$ added as a sintering aid are compounded as $Al_2Y_4O_9$ in the SiC crystal grain boundary during sintering process.

In addition, in the α-SiC raw material powder used in the present invention, content of the free $SiO_2$ included in the SiC raw material is reduced to 0.3% or less, so that $SiO_2$ that is not excellent in the plasma resistance hardly exists in the sintered body material; and moreover, the α-SiC sintered body without forming much amount of $3Al_2O_3·2SiO_2$ to $2Al_2O_3·SiO_2$ or a mullite component such as $Al_6O_{13}Si_{12}$, these being produced by reaction of $SiO_2$ with $Al_2O_3$ that is blended as the sintering aid and having the molecular weights several times as large as $SiO_2$, can be formed.

In the α-SiC raw material powder used in the present invention, the free $SiO_2$ contained in the SiC raw material is reduced to 0.3% or less. As a result, almost no $SiO_2$, which is not so excellent in plasma resistance, is present in the sintered body material. Furthermore, the α-SiC raw material powder used in the present invention can produce the α-SiC sintered body in which mullite component having several times the molecular weight of $SiO_2$ such as $3Al_2O_3·2SiO_2$ to $2Al_2O_3·SiO_2$ or $Al_6O_{13}Si_2$ is not generated in a large amount even if $SiO_2$ react with $Al_2O_3$ added as a sintering aid.

Next, using a conventional edge ring currently commonly used as a genuine product (CVD-SiC) and an inventive edge ring produced in Example 4, a plasma etching test was conducted under the following conditions.

In an inductively coupled type plasma etching apparatus for an 8 inch wafer, $Ar/CF_4$ was flowed at 20/10 sccm, and a multilayered film of the silicon oxide film and the polysilicon film was etched at a pressure of 1 Pa to form holes.

For plasma excitation, electric power of 2000 W at 13.56 MHz was applied to an antenna, and electric power of 1000 W at 13.56 MHz was applied to a substrate on which a silicon wafer was placed.

This structure can be suitably used to form a vertical gate for a three-dimensional NAND flash memory.

In addition, the edge ring produced in present Example is excellent in terms of plasma resistance as compared with the edge ring of the genuine product (CVD-SiC). This reduces the amount of SiC components gasified and released into the gas phase during the etching.

FIGS. 4A and 4B are views depicting a sectional shape of a hole formed in this way, where FIG. 4A depicts a sectional shape of the hole formed by using the conventional edge ring, and FIG. 4B depicts a sectional shape of the hole formed by using an edge ring formed of the same material characteristics as the sintered bodies prepared by Example 4 of the present invention (#4, #5, and #6). FIG. 4C illustrates the scale used in FIGS. 4A and 4B.

As can be seen from FIGS. 4A-4C, the conventional SiC edge ring as the genuine product is etched with F-base radicals, and then the radicals are gasified into $SiF_4$, $CF_4$ or the like and discharged from the edge ring. As such, the density and electric potential of the plasma have been different between the center of the wafer and the periphery of the wafer close to the edge ring.

For this reason, abnormality in the etching shape occurred only at the periphery of the wafer, so that control of fine dimensions became difficult, and the yield after etching has been deteriorated.

On the other hand, in the sintered body according to the present invention, the rate of gasification of the edge ring by the plasma became smaller as compared with that of the conventional edge ring, so that the distributions of plasma density and electric potential became uniform.

As a result, as shown in FIG. 4B, it was possible to form vertical holes, and to suppress occurrence of abnormality in the etching shape. This also improved process yield.

Such an advantageous effect is not limited to the above process and the etching apparatus used.

In recent years, development and improvement of semiconductors has progressed toward increasingly miniaturization, and it is aimed at forming the groove width of plasma etching to 10 nm or less.

Accuracy of an etching pattern is essential to miniaturization of semiconductors, and exerts a great influence on the yield of semiconductor production. The present invention makes it possible to improve the yield of production.

Example 6

After crushing/mixing—granulating—press—forming a mixture of 100 weight parts of the same α-SiC raw material powder as the one used in Example 1, 1.2 weight parts of boron with the purity of 99.99% and the average particle diameter of 1 μm, 0.5 weight parts of carbon back with the average particle diameter of 0.02 μm, and similarly to Example 1, 3.5 weight parts of an acryl-type water-soluble binder and water as the solvent, the test piece thereby obtained was sintered at 2180° C. in an argon atmosphere furnace. As a result, the sintered body with the specific gravity of 3.10 was obtained, so that almost the same results in the material characteristics as those of the material obtained by using $B_4C$ as the sintering aid could be obtained.

Modifications of the Examples will be listed below.

(1) In Examples 1 to 5, the α-SiC particles having an average particle size of 0.6 μm was employed. However it found that it is possible to obtain a sintered body having equivalent properties as long as the average particle size of the α-SiC is a range of 0.3 to 3 μm, and to obtain a dense sintered body as long as the average particle size of is a range of 0.3 to 1 μm.

(2) In Examples 1 and 3, the $B_4C$ raw material powder having an average particle size of 1 μm or less was employed as a sintering aid, and in Example 2, the fine $Al_2O_3$ powder having an average particle size of 0.5 μm and the fine $Y_2O_3$ powder having an average particle size of 1 μm or less were employed as a sintering aid.

However, as a result of repeated experiments, it found that it is possible to obtain a sintered body having equivalent properties as long as the average particle size of $B_4C$ is a range of 0.3 to 2 μm, and to obtain more dense sintered body as long as the average particle size of $B_4C$ is a range of 0.3 to 1 μm.

Further, it is possible to obtain a sintered body having equivalent properties as long as each of the average particle sizes of the fine $Al_2O_3$ powder and the fine $Y_2O_3$ powder is, respectively, a range of 0.3 to 3 μm, and to obtain a dense sintered body as long as each of the average particle sizes is, respectively, a range of 0.3 to 2 μm. Further, by employing the fine powders having the average particle sizes of 1 μm or less, it is possible to obtain a sintered body having a low temperature sinterability.

(3) In Example 1, the $B_4C$ as a sintering aid was added to the α-SiC raw material powder in amount of 0.5 to 5 weight parts. In Example 2, 2.5 weight parts of the $Al_2O_3$ raw material powder and 5 weight parts of the $Y_2O_3$ raw material powder were each added to 100 weight parts of the α-SiC raw material powder. In Example 3, the $B_4C$ as a sintering aid was added to the α-SiC raw material powder in amount of 1.5 weight parts. In Example 4, 2 or 3.5 weight parts of the $Al_2O_3$ raw material powder and 4 or 7 weight parts the $Y_2O_3$ raw material powder were each added to 100 weight parts of the α-SiC raw material powder. And in Example 5, 3.5 weight parts of the $Al_2O_3$ raw material powder and 7 weight parts of the $Y_2O_3$ raw material powder were each added to 100 weight parts of the α-SiC raw material powder.

However, as a result of repeated experiments, when using $B_4C$ as a sintering aid, it was found that a mixing amount of $B_4C$ raw material powder added with respect to total amount of the α-SiC raw material powder and the $B_4C$ raw material powder is preferably a range of 0.5 to 5 weight parts, more preferably a range of 1 to 2 weight parts, and the best range of 0.75 to 1.0 weight parts.

Further when using the $Al_2O_3$ and $Y_2O_3$ as a sintering aid, it was found that a total mixing amounts of the $Al_2O_3$ raw material powder and the $Y_2O_3$ raw material powder added to 100 weight parts of the α-SiC raw material powder were preferably a range of 3 to 15 weight parts, and more preferably a range of 6 to 12 weight parts.

Specifically, when the total mixing amount is 3 weight parts, $Al_2Y_4O_9$ is formed in a crystal grain boundary by adjusting the mixing ratio of 1 weight part of $Al_2O_3$ and 2 weight parts of $Y_2O_3$.

(4) In Example 1, sintering (Argon Sintering) was carried out using $B_4C$ as a sintering aid in the argon atmosphere furnace. In Example 2, sintering (High-frequency Sintering) was carried out using $Al_2O_3$ and $Y_2O_3$ as a sintering aid in the high-frequency induction heating furnace. In Example 3, sintering (Hot Press Sintering) was carried out by the hot press using $B_4C$ as a sintering aid. In Example 4, sintering (Argon Sintering) was carried out using $Al_2O_3$ and $Y_2O_3$ as a sintering aid. However, high-frequency sintering may be performed using $B_4C$ as a sintering aid, or hot press sintering may be performed using $Al_2O_3$ and $Y_2O_3$ as a sintering aids.

(5) As to the sintering process, the SiC member sintered in an inert atmosphere furnace is further subjected to HIP processing, and thereby it is possible to obtain a dense sintered body having very few spores.

For example, a SiC member was obtained by adding 1.5 weight parts of $B_4C$ and sintering in an inert atmosphere furnace to have a specific gravity of 3.144 (relative density of 97.9%), and this obtained SiC member was further subjected to HIP processing at 2000 atmospheric pressure and 2000° C. for 1.5 hours. As a result, the resulting SiC member could be densified to have the specific gravity of 3.185 (relative density 99.3%).

Although argon is used as the atmospheric gas during high-temperature sintering of the SiC member of the present invention, an inert gas other than argon, or non-oxidizing atmosphere gas can also be used.

(6) In Examples 1 and 2, with regard to the impurities included in the α-SiC raw material powder, an amount of the metal impurity was 37 to 70 ppm, an amount of the Al impurity was 28 to 45 ppm, and an amount of the metal impurity other than Al was 9 to 25 ppm. As a result of the tests on various raw material powders, with regard to the impurities included in the α-SiC raw material powder, it was found that with regard to the metal impurity other than Al it is better when an amount thereof is smaller and that with regard to the Al impurity it is good even when an amount thereof is somewhat large. Therefore, it can be said that it is good when a total amount is more than 20 ppm and 70 ppm or less, an amount of the Al impurity is 50 ppm or less, and an amount of the metal impurity other than Al is 20 ppm or less.

More preferably, a total amount is more than 20 ppm and 60 ppm or less, an amount of the Al impurity is 45 ppm or less, and an amount of the metal impurity other than Al is 15 ppm or less, while still more preferably a total amount is 55 ppm or less, an amount of the Al impurity is 45 ppm or less, and an amount of the metal impurity other than Al is 10 ppm or less.

(7) From Examples 1 to 5, various characteristics required for the member for the plasma processing apparatus can be satisfied when the relative density of the sintered body is 93.0% or more, more preferably 93.9% or more, and the dielectric loss is less than $1 \times 10^{-1}$, and the YAM phase component is present in the SiC crystal grain boundary of the sintered body, in some cases the YAP phase component ($AlYO_3$) or the YAG phase component ($Al_5Y_3O_{12}$) is slightly present, and the average crystal particle diameter of the SiC crystal is 10 μm or less, preferably 7 μm or less, while more preferably 5 μm or less.

DESCRIPTION OF SYMBOLS

1 Semiconductor wafer
2 Reaction chamber

3 Shower head type upper electrode
4 Lower electrode
5 Hollow portion
6 Gas supply hole
7 Exhaust plate
8 Electrostatic chuck
9 Edge ring
10 High-frequency power supply

The invention claimed is:

1. A silicon carbide member for a plasma processing apparatus, which consists of a sintered body formed by sintering a shaped body of an α-structure silicon carbide raw material powder containing metal impurities in an amount of 37 to 70 ppm and an Al impurities in an amount of 28 to 45 ppm and free $SiO_2$ components to become 0.3% or less before sintering, and an oxide-based sintering aid at a temperature of 1800° C. to 2200° C., wherein the oxide-based sintering aid comprises $Al_2O3$ and $Y_2O_3$, wherein a total amount of the $Al_2O_3$ and the $Y_2O_3$ is the range of 3 to 15 weight parts as relative to 100 weight parts of the α-structure silicon carbide, and a weight of the $Y_2O_3$ is 1 to 2 times a weight of the $Al_2O_3$, wherein $Al_2Y_4O_9$ exists in a grain boundary of an α-silicon carbide crystal grain after sintering.

* * * * *